US009706642B2

(12) United States Patent
Lin (10) Patent No.: US 9,706,642 B2
(45) Date of Patent: Jul. 11, 2017

(54) METHOD AND DEVICE FOR DIFFERENTIAL SIGNAL CHANNEL LENGTH COMPENSATION IN ELECTRONIC SYSTEM

(75) Inventor: Shengli Lin, San Jose, CA (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 1435 days.

(21) Appl. No.: 12/869,910

(22) Filed: Aug. 27, 2010

(65) Prior Publication Data

US 2012/0048599 A1    Mar. 1, 2012

(51) Int. Cl.
| | |
|---|---|
| H05K 1/02 | (2006.01) |
| H01P 3/04 | (2006.01) |
| H01P 3/02 | (2006.01) |
| H05K 1/11 | (2006.01) |

(52) U.S. Cl.
CPC ......... *H05K 1/0253* (2013.01); *H05K 1/0216* (2013.01); *H01P 3/02* (2013.01); *H01P 3/04* (2013.01); *H05K 1/0225* (2013.01); *H05K 1/0231* (2013.01); *H05K 1/0245* (2013.01); *H05K 1/111* (2013.01); *H05K 2201/10636* (2013.01); *Y02P 70/611* (2015.11)

(58) Field of Classification Search
CPC ..... H01P 3/02; H01P 3/04; H01P 3/08; H05K 1/0216; H05K 1/0225; H05K 1/0245
USPC .......... 174/250–268; 361/728–837; 333/238, 333/204, 246, 1, 4, 5, 33, 34
See application file for complete search history.

(56) References Cited

U.S. PATENT DOCUMENTS

| | | | | |
|---|---|---|---|---|
| 4,186,352 A | * | 1/1980 | Hallford | ........................ 455/327 |
| 4,399,562 A | * | 8/1983 | Hallford | ........................ 455/327 |
| 4,603,309 A | * | 7/1986 | Renken | ......................... 333/101 |
| 4,736,165 A | * | 4/1988 | Chao et al. | .................... 330/149 |
| 6,041,224 A | * | 3/2000 | Wada | ............................. 455/327 |
| 6,605,876 B2 | * | 8/2003 | Chang | ..................... H01L 23/48 |
| | | | | 257/668 |
| 6,624,729 B2 | * | 9/2003 | Wright et al. | ................. 333/238 |
| 6,665,927 B1 | * | 12/2003 | Dow et al. | ....................... 29/825 |
| 7,102,456 B2 | * | 9/2006 | Berg | ....................... H01P 3/081 |
| | | | | 333/238 |
| 7,215,226 B2 | * | 5/2007 | Lee | ................................ 333/204 |
| 7,830,223 B2 | * | 11/2010 | Ahmad | ........................... 333/33 |
| 8,040,200 B2 | * | 10/2011 | Minegishi et al. | ................ 333/4 |
| 8,115,568 B2 | * | 2/2012 | Hsu | ................................ 333/33 |
| 8,248,183 B2 | * | 8/2012 | Syal | ........................ H01P 3/081 |
| | | | | 333/238 |

(Continued)

*Primary Examiner* — Zachary M Pape
(74) *Attorney, Agent, or Firm* — Sterne, Kessler, Goldstein & Fox, P.L.L.C.

(57) ABSTRACT

Embodiments of the present invention are directed to providing a time delay to a shortened trace in a differential microstrip trace pair. By adding back metal to a ground plane associated with a DC blocking capacitor, a time delay can be added to the shortened trace. The cutout associated with the longer trace remains unaltered. In a further embodiment, both cutouts can be modified with the addition of metal, with the cutout associated with the shorter trace receiving more metal than the other cutout. In a further embodiment of the present invention, a cutout associated with a connector can be modified to add back metal in the cutout. The cutout associated with the shorter trace is modified while the other cutout is left unchanged.

20 Claims, 9 Drawing Sheets

(56) References Cited

U.S. PATENT DOCUMENTS

2002/0084107 A1* 7/2002 Chang et al. ................ 174/262
2011/0128086 A1* 6/2011 Hsu et al. ........................ 333/1

* cited by examiner

METHOD AND DEVICE FOR DIFFERENTIAL SIGNAL CHANNEL LENGTH COMPENSATION IN ELECTRONIC SYSTEM

BACKGROUND

Field of the Invention

The present invention relates generally to circuit boards and communication systems, and in particular to structures and methods for differential signal channel length compensation in communication systems.

Background Art

Data transmission speed requirements have dramatically increased over recent years. Electronic systems typically use printed circuit boards that are interconnected to produce various functionalities of the data transmission process. Each printed circuit board contains two or more layers upon which components are placed. Connectivity between printed circuit boards and external systems proceeds by way of connectors. Connectivity between individual components on a printed circuit board is accomplished by way of conductive paths that are commonly referred to as metal traces, or just traces.

With the increased data transmission speed requirements and the need for reduced circuit board size, the type of traces and the routing of those traces within the circuit board are important design considerations. Smaller circuit board size requires the placement of traces in close proximity with one another. However, the close proximity of traces to one another increases the possibility of noise generation and crosstalk between the traces.

One way of avoiding the above problems is to use differential signals. Differential signals are signals that are represented by a pair of signal traces. The voltage difference between the pair of signal traces represents the desired signal. Thus, if external noise or cross talk from a neighboring trace couples into the pair of signal traces, then the coupling would be similar in both of the signal traces. Consequently, the difference in those signal traces remains relatively unaffected and thus immunity to electromagnetic interference (EMI) is enhanced.

Differential signals require that the individual traces of each differential pair be as identical as possible when routed across the printed circuit board. In particular, it is desirable that the lengths of individual traces in a pair be reasonably identical to each other. Differences in the lengths of individual traces in a differential pair result in undesired timing differences in the individual signals. Thus, one signal in the shorter trace of the pair arrives earlier than the signal in the other trace of the pair. Consequently, although the two signals are nominally equal and opposite, the differential signal is degraded by the timing difference or skew in the trace pair. Length mismatches are difficult to avoid in PCB design due to various factors including constraints of PCB stackup, PCB size, component placement, routing density and routing length.

Although the above considerations require identical trace lengths within a differential pair, such a requirement is difficult to meet. Real estate on modern day printed circuit boards is a premium and the ability to route differential traces so that both traces are identical in length faces numerous obstacles. Thus, a circuit layout design can result in unequal trace lengths based on meeting other circuit objectives. Moreover, traditional methods of length matching, such as serpentine routing, do not work well in a multi-gigaHertz differential signaling environment since these traditional methods impair the differential property of the differential trace pair.

BRIEF SUMMARY

What is needed is a structure and method to reduce the impact of the unequal path lengths in a differential pair trace. In addition, it is desirable that such a structure and method not impose any significant additional technical or quality assurance challenges in the printed circuit design and layout process. It is further desirable that the device and method not impose any significant additional costs to the finished printed circuit board.

In one embodiment of the present invention, a cutout associated with a DC blocking capacitor can be modified to add back metal in the cutout. The cutout associated with the shorter trace is modified while the other cutout is left unchanged. In a further embodiment, both cutouts can be modified through the addition of metal, with the cutout associated with the shorter trace receiving more metal than the other cutout.

In a further embodiment of the present invention, a cutout associated with a connector can be modified to add back metal in the cutout. The cutout associated with the shorter trace is modified while the other cutout is left unchanged. In a further embodiment, both cutouts can be modified with the addition of metal, with the cutout associated with the shorter trace receiving more metal than the other cutout.

Further embodiments, features, and advantages of the invention, as well as the structure and operation of the various embodiments of the invention are described in detail below with reference to the accompanying drawings.

BRIEF DESCRIPTION OF THE DRAWINGS/FIGURES

Embodiments of the present invention are described with reference to the accompanying drawings. In the drawings, like reference numbers indicate identical or functionally similar elements.

DETAILED DESCRIPTION

While the present invention is described herein with reference to illustrative embodiments for particular applications, it should be understood that the invention is not limited thereto. Those skilled in the art with access to the teachings provided herein will recognize additional modifications, applications, and embodiments within the scope thereof and additional fields in which the present invention would be of significant utility.

Figure 1:
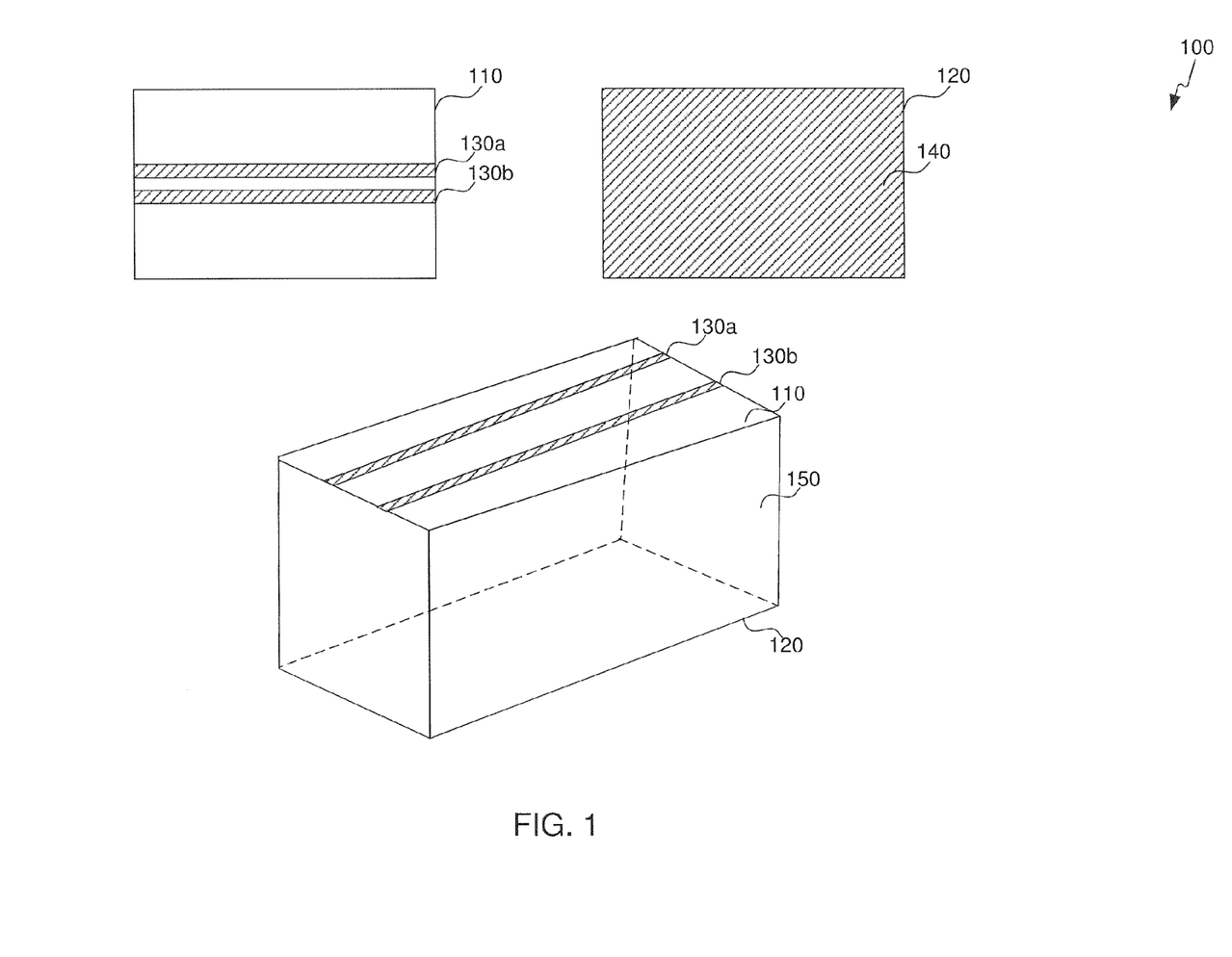
FIG. 1 depicts a printed circuit board with microstrip differential traces.

FIG. 1 depicts a printed circuit board 100. Printed circuit board 100 contains at least two surfaces 110 and 120 of dielectric layer 150. Surfaces 110 and 120 are metal layers in that metal is deposited in a desired pattern on surfaces 110 and 120. Surface 120 is almost all or completely covered with metal and is referred to as a ground plane 140. On surface 110, traces 130a and 130b are metal conduction paths by which electrical signals can propagate. More completely, traces 130a, 130b and ground plane 140 form a differential electrical circuit. Ideally, traces 130a and 130b are identical in length, width, metal layer and are parallel to one another. Traces 130a and 130b are used to carry differential signals with the ground 140 as a reference.

As noted earlier, differential signals are signals that are carried by a pair of signal traces. The voltage difference between the pair of signals represents the desired signal. Thus, if a voltage signal V1 propagates on trace 130a and a voltage signal V2 propagates on trace 130b, the desired signal for transmission is represented by the difference in voltage signals V1 and V2. Differential signal generators generate the desired signal Vdiff as the difference of the two signals, V1 and V2, where V1 is 0.5*Vdesired, V2 is the negative of V1 and is −0.5*Vdesired. In an ideal situation, the common mode signal, Vcomm, is zero, since Vcomm=0.5*(V1+V2).

As noted previously, modern day circuitry is faced with increased data transmission speed requirements. Signal transmissions often use multi-GHz (multi-gigaHertz) clock rates and differential signaling is dominant in meeting the high speed transmission data rates. Some examples of current multi-GHz signaling standards are PCI-Express (PCI-E), SFI (serdes framer interface), XFI (10 gigabit per second chip-to-chip electrical interface) and KR (10 gigabit per second backplane Ethernet standard). In many of these high speed signaling standards, a DC-blocking capacitor is required on the signal transmission length. Such a DC-blocking capacitor ensures that devices at either end of the transmission path can maintain different DC offset voltages.

Figure 2:
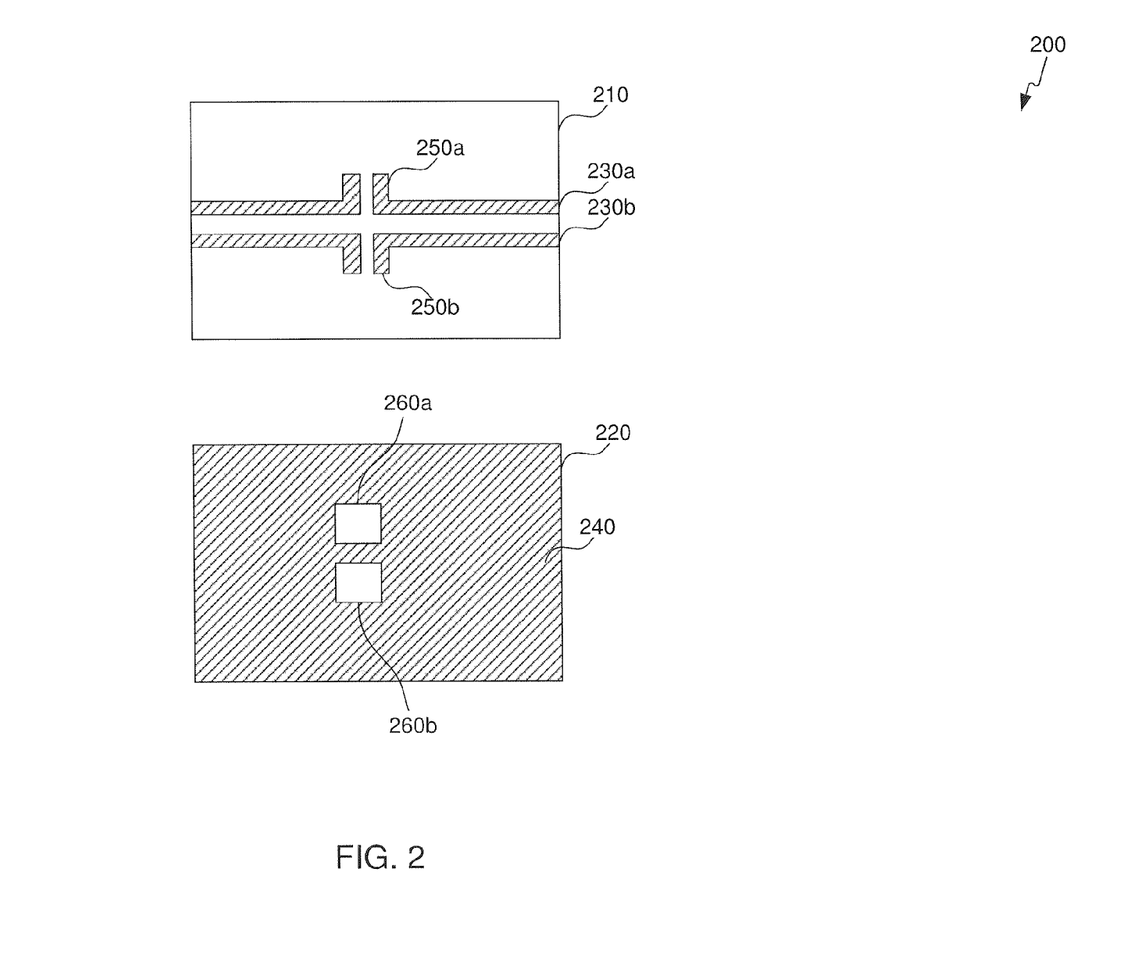
FIG. 2 depicts a symmetric ground plane cutout configuration associated with DC blocking capacitors in a differential trace circuitry.

FIG. 2 illustrates the circuit board connection for a DC blocking capacitor. In order for the DC blocking capacitor to be connected to the printed circuit board 200, a solder pad is provided to support the associated fabrication effort. Typical solder pad dimensions are driven by the size of the DC blocking capacitor, and therefore the solder pad dimensions are larger than the width of the corresponding traces 230a, 230b. The characteristic impedance of traces 230a, 230b are determined, in part, by the width of traces 230a, 230b. For microstrip lines, the larger the width of trace, the lower the impedance. Thus, the provision of solder pads 250a, 250b result in a lower characteristic impedance over the length of the solder pad. Thus, in an illustration, the trace impedance of 100 ohms becomes a trace impedance of less than 100 ohms at the solder pales 250a, 250b, prior to returning to 100 ohms for the rest of the trace length. Abrupt changes in characteristic impedance lead to reflections that degrade the signal integrity of signals propagating from one end of the trace to the other.

In order to diminish the deleterious impedance discontinuity effects of solder pads 250a, 250b, a portion of the metal in ground plane 240 is removed. Such removed metal is commonly referred to as a cutout. Typically, cutouts 260a, 260b are aligned to be vertically above or below the corresponding pads. Thus, as an illustration, if solder pads 250a, 250b are 40 mil×20 mil, then, cutouts 260a, 260b are also 40 mil×20 mil and vertically aligned to the corresponding solder pads 250a, 250b. Such cutouts 260a, 260b are typically symmetric to match the symmetry of the differential signal traces and associated solder pads 250a, 250b.

Figure 3:
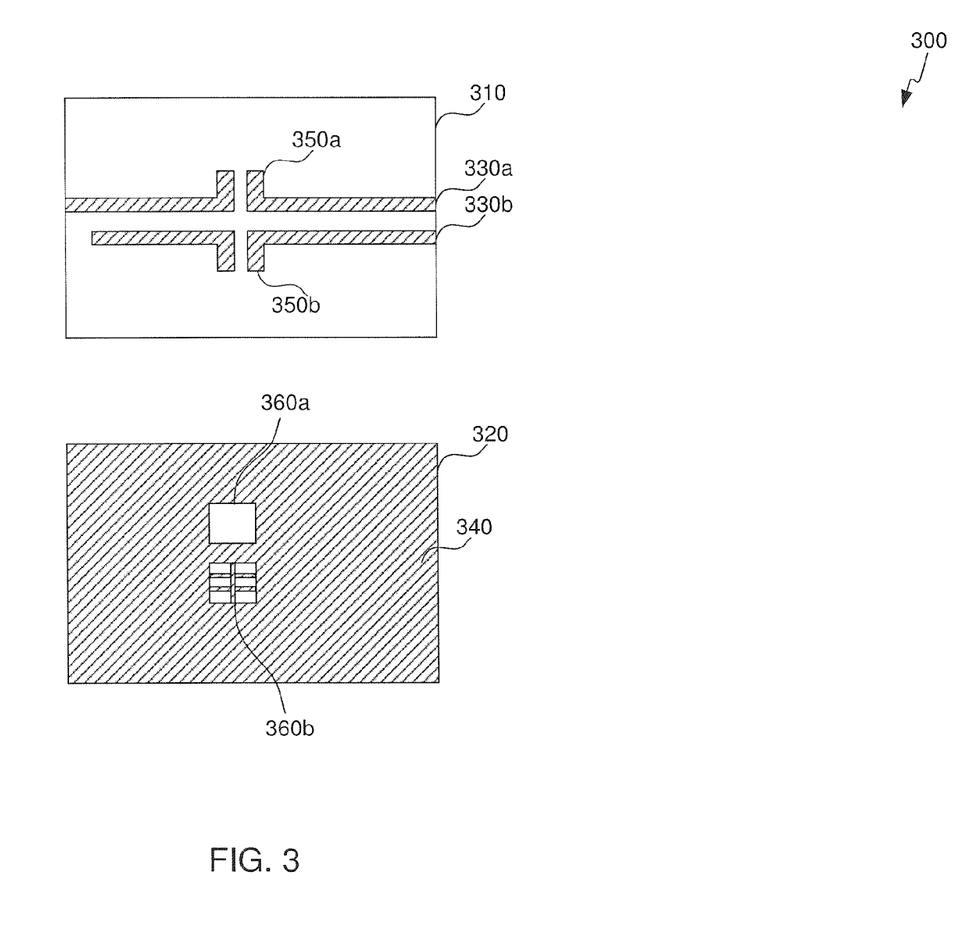
FIG. 3 depicts an asymmetric ground plane cutout configuration associated with DC blocking capacitors, in accordance with an embodiment of the present invention.

In an embodiment of the present invention, FIG. 3 illustrates a trace length mismatch technique. FIG. 3 depicts a printed circuit board 300. Like printed circuit boards 100 and 200, printed circuit board 300 contains at least two surfaces 310 and 320. Surfaces 310 and 320 are metal layers in that metal is deposited in a desired pattern on surfaces 310 and 320, with surface 320 containing ground plane 340. Surface 310 contains differential traces 330a and 330b, with trace 330b shorter than trace 330a by a particular distance. For illustrative purposes only, some of the results below assume a difference in length of 12 mil. However, as one of ordinary skill in the art would appreciate, the difference in length is not limited to such a length. As before, cutouts 360a, 360b are aligned to be vertically above or below the corresponding pads. In this embodiment, a delay is added to the shortened trace 330b to compensate for the shortened length relative to trace 330a. The delay is added by adding metal to corresponding cutout 360b. Thus, like the traces 330a, 330b that are asymmetric in their length, the cutouts 360a, 360b are now asymmetric. Cutout 360a maintains its previous cutout shape and dimensions. However, cutout 360b has metal added inside the cutout area. In this illustration shown in FIG. 3, two lengthwise metal stripes and one perpendicular metal stripe are added. Thus, cutout 360b continues to have substantially the same perimeter as cutout 360a, but cutout 360b now includes patterned metal in its interior. Such a pattern is shown for illustrative purposes only. However, as one of ordinary skill in the art would appreciate, the addition of metal to cutout 360b is not limited to any particular pattern. The add-back of the metal to cutout 360b results in increased inductance of trace 330b, and a consequential increase in propagation time for signals that travel along trace 330b.

Figure 4:
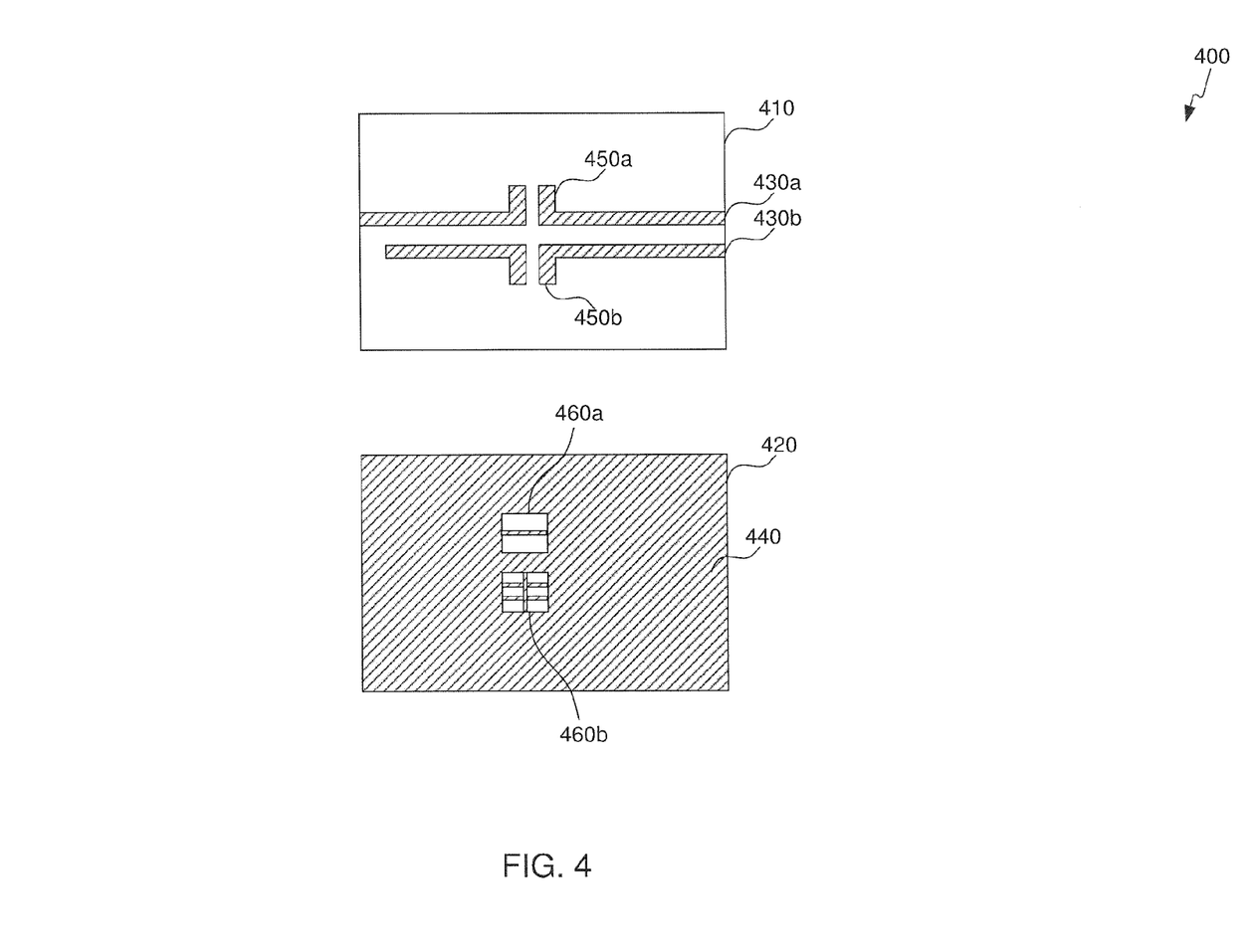
FIG. 4 depicts an alternative asymmetric ground plane cutout configuration associated with DC blocking capacitors, in accordance with an embodiment of the present invention.

In a further embodiment of the present invention, FIG. 4 illustrates an alternative pattern of add-back metal. FIG. 4 depicts a printed circuit board 400. Like printed circuit boards 100, 200 and 300, printed circuit board 400 contains at least two surfaces 410 and 420. Surfaces 410 and 420 are metal layers in that metal is deposited in a desired pattern on surfaces 410 and 420, with surface 420 containing ground plane 440. Surface 410 contains differential traces 430a and 430b, with trace 430b being shorter than trace 430a by a particular distance. As before, cutouts 460a, 460b are aligned to be vertically above or below the corresponding pads. In this embodiment, a delay is again added to the shortened trace 430b to compensate for the shortened length relative to trace 430a. However, in this embodiment, metal is added to both cutouts 460a, 460b, but more metal is added back to cutout 460b than to cutout 460a. The uneven add-back of the metal to cutout 460b (compared to cutout 460a) results in increased inductance of trace 430b, and a consequential increase in propagation time for signals that travel along trace 430b.

Figure 5:
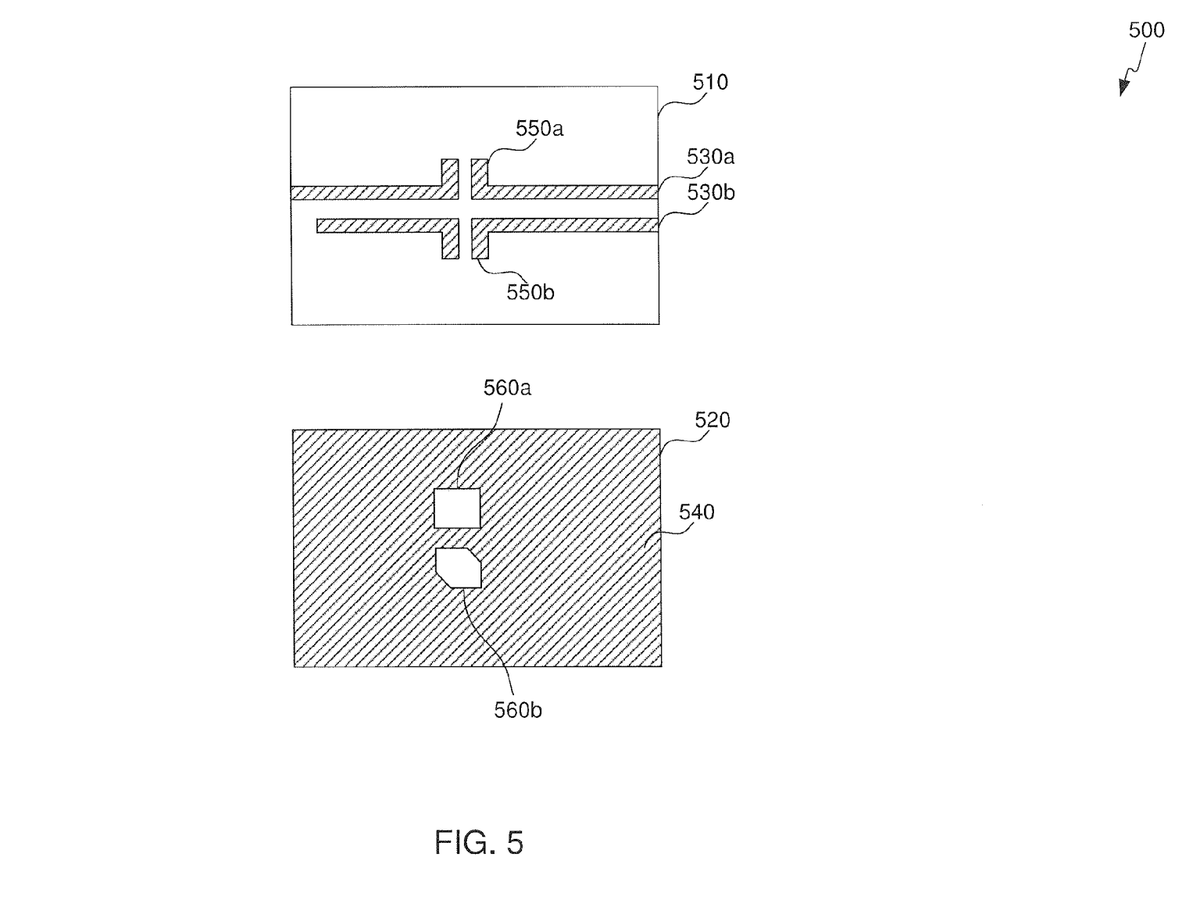
FIG. 5 depicts a further alternative asymmetric ground plane cutout configuration associated with DC blocking capacitors, in accordance with an embodiment of the present invention.

In a still further embodiment of the present invention, FIG. 5 illustrates an alternative pattern of add-back metal. FIG. 5 depicts a printed circuit board 500. Like printed circuit boards 100, 200, 300 and 400, printed circuit board 500 contains at least two surfaces 510 and 520. Surfaces 510 and 520 are metal layers in that metal is deposited in a desired pattern on surfaces 510 and 520, with surface 520 containing ground plane 540. Surface 510 contains differential traces 530a and 530b, with trace 530b being shorter than trace 530a by a particular distance. As before, cutouts 560a, 560b are aligned to be vertically above or below the corresponding pads. In this embodiment, a delay is again added to the shortened trace 530b to compensate for the shortened length relative to trace 530a. However, in this embodiment, no metal is added back to cutout 560a. Metal is added back to cutout 560b by chamfering two of the four corners of cutout 560b. The add-back of the metal to cutout 560b results in increased inductance of trace 530b, and a consequential increase in propagation time for signals that travel along trace 530b.

Figure 6:
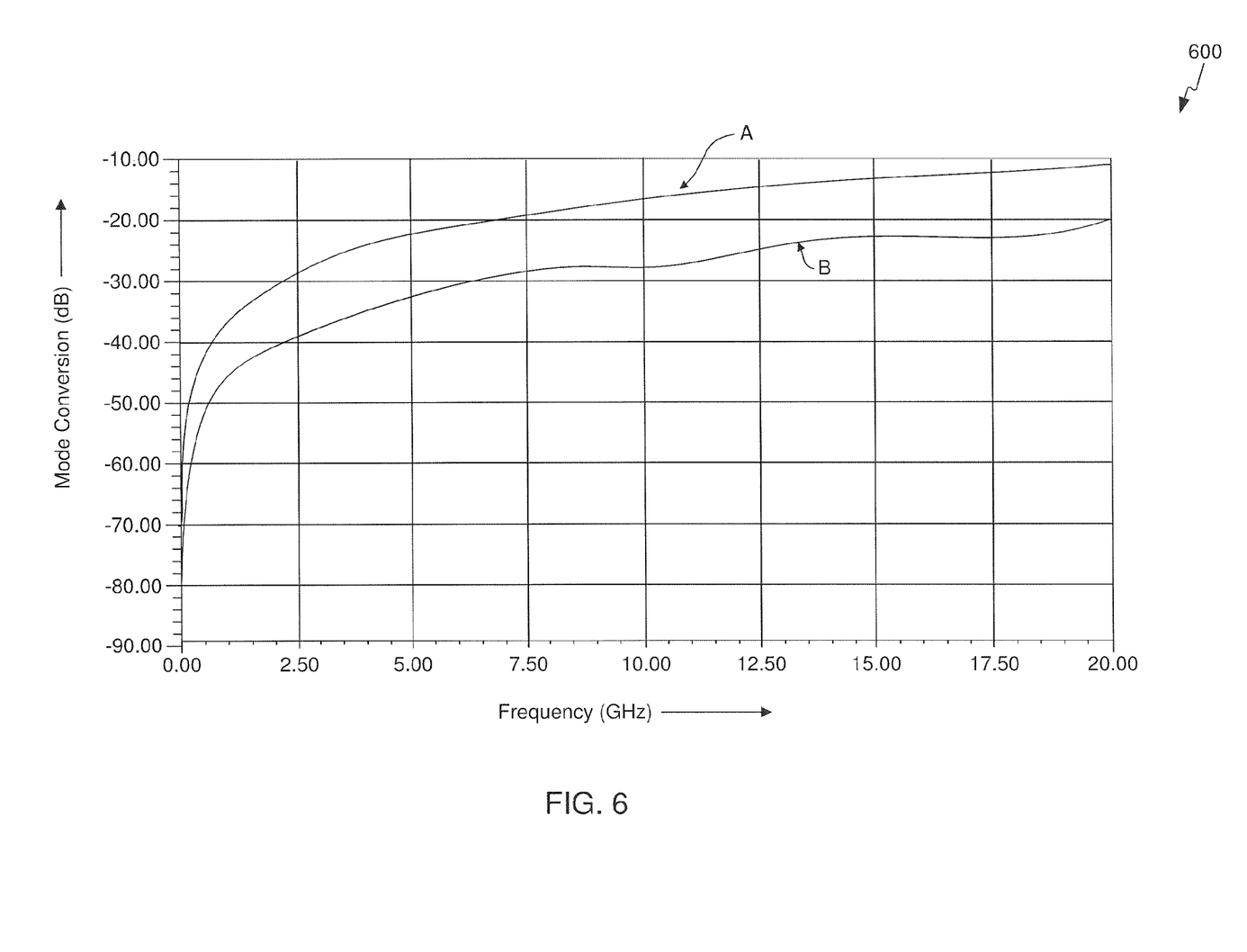
FIGS. 6 and 7 illustrate a reduced differential-to-common-mode conversion, according to an embodiment of the current invention.
Figure 7:
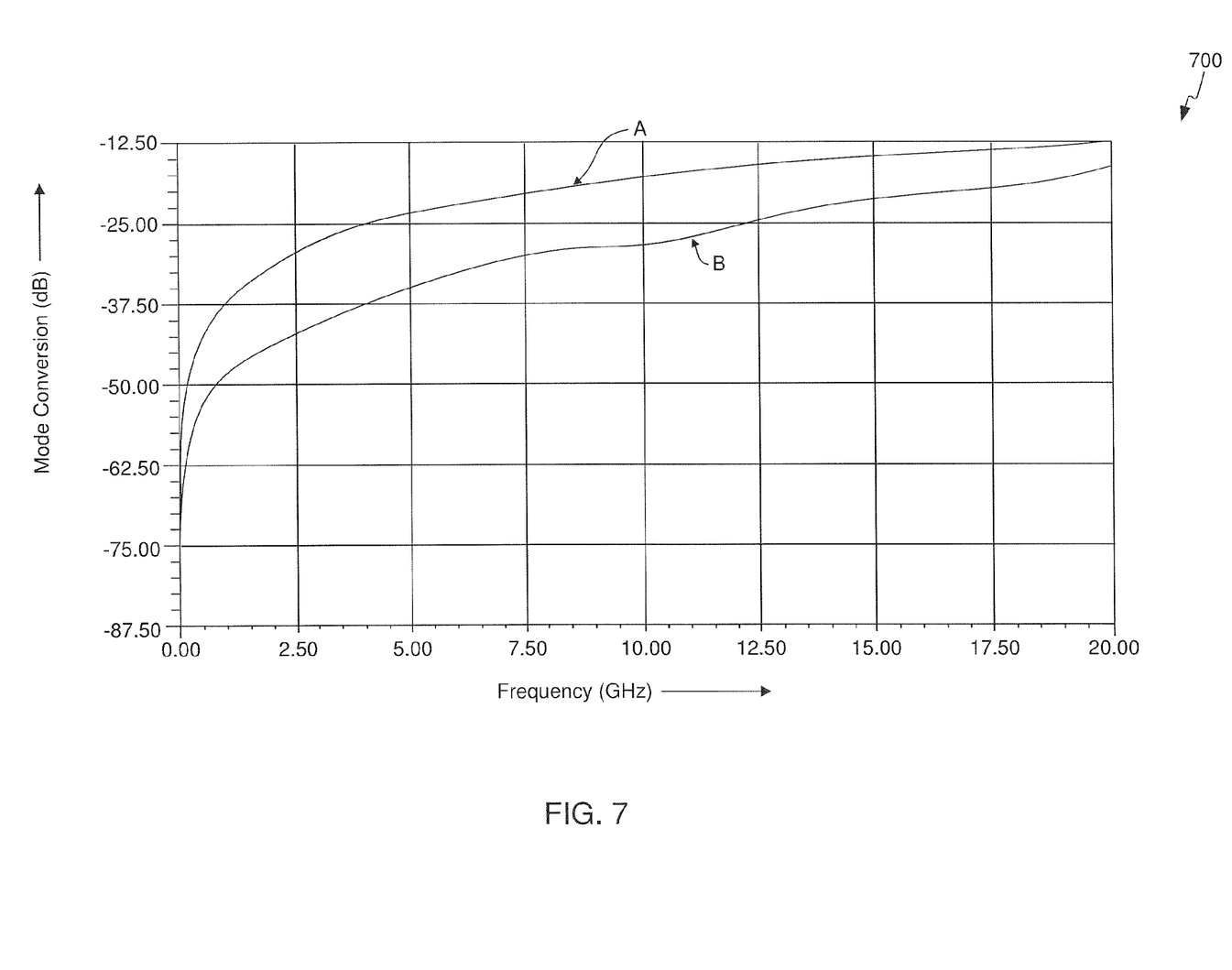
Figure 8:
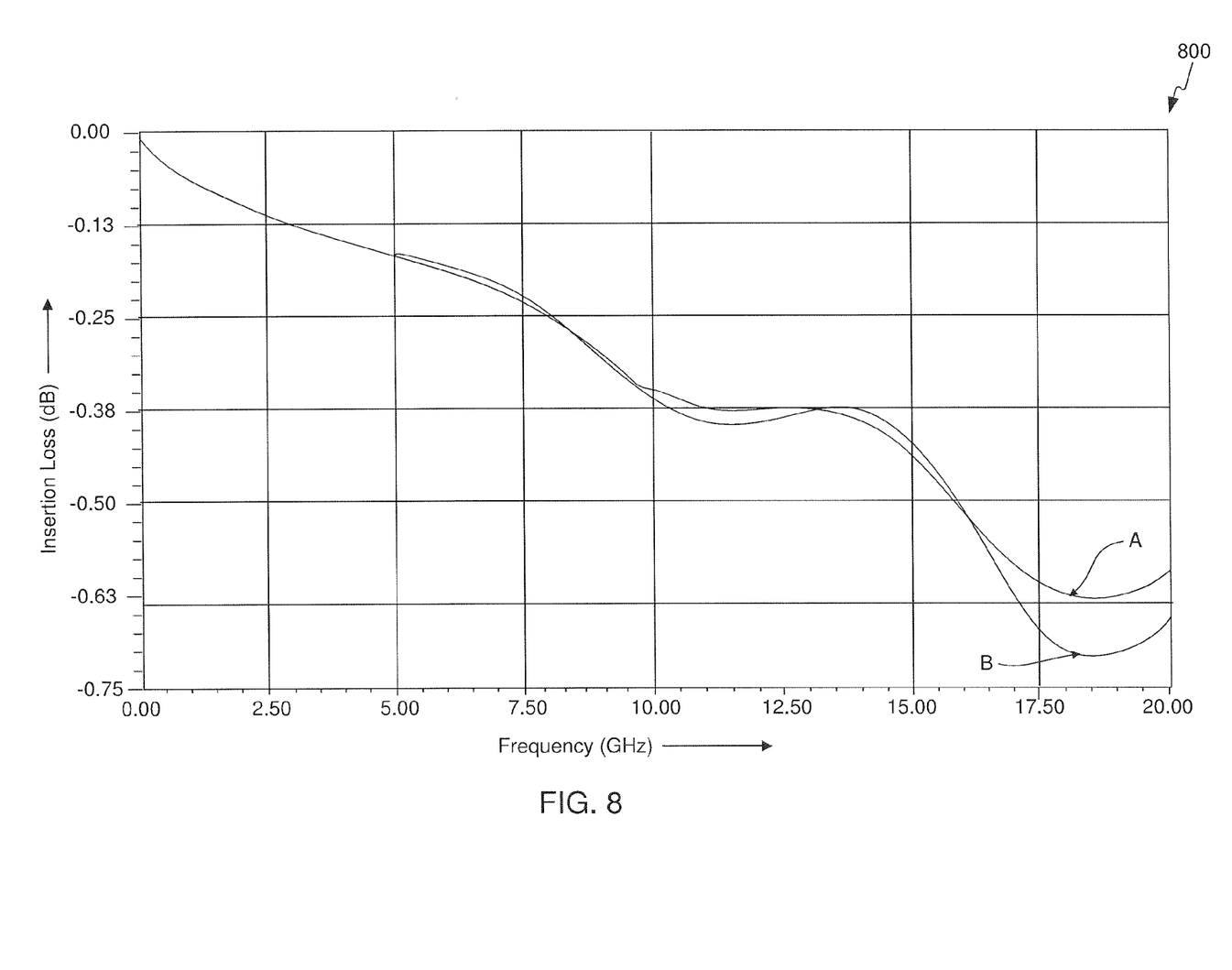
FIG. 8 illustrates the insertion loss for an asymmetric ground plane cutout, according to an embodiment of the current invention.

Simulations have been performed using measured s-parameters of the cutout configuration shown in FIG. 3. Without the benefit of the asymmetric cutout additions, a common mode peak-peak voltage of 51 mV and a time skew between the traces of 1.7 ps results from a differential pair with one trace shortened by 12 mil. However, with the benefit of the asymmetric cutout additions to 360a, 360b, the common mode peak-peak voltage is reduced to 31 mV and the time skew between the traces is reduced to 0.6 ps. FIGS. 6 and 7 illustrate the respective differential-to-common-mode conversions of traces 330a and 330b, compared with the respective differential-to-common-mode conversions of traces 230a and 230b. In both FIGS. 6 and 7, curve A indicates the differential-to-common-mode conversion for the case of symmetric cutouts 260a, 260b. Curve B indicates an improved differential-to-common-mode conversion for the case of asymmetric cutouts 360a, 360b, in accordance with an embodiment of the present invention. As can be seen, the asymmetric cutout provides a smaller (better) differential-to-common-mode conversion. FIG. 8 illustrates the insertion loss for the symmetric cutout and the asymmetric cutout. Curve B illustrates the insertion loss for the case of symmetric cutouts 260a, 260b. Curve A illustrates the insertion loss for the case of asymmetric cutouts 360a, 360b. As FIG. 8 illustrates, the insertion loss is relatively unchanged over the frequency range DC through to 16 GHz.

As one skilled in the art would recognize, FIG. 3 illustrates one embodiment of the present invention. Other patterns and amounts of add-backs of metal into the cutout associated with the shortened trace fall within the concept of the present invention. Moreover, add-backs of metal into both cutouts can be made, with the cutout associated with the shortened trace receiving additional metal add-back relative to the longer lease. Add-back metal can be configured in a variety of shapes such that the add-back metal is coupled to the ground plane. For example, the add-back metal can include one or more metal members that extend across the inner space of cutout 360b. Two or more metal members can be placed perpendicular to one another across the inner open space of cutout 360b.

More, generally, first cutout 360a (that corresponds to first metal trace 330a) can have first metal pattern disposed in the open area portion of the cutout 360a, and second cutout 360b (that corresponds to second metal trace 330b) can have a second metal pattern in the open area portion of the cutout 360b, where the second metal pattern is different from the first metal pattern. Further, the second metal pattern is configured to compensate for the shorter length of metal trace 330b relative to metal trace 330a. In other words, the second metal pattern adds signal delay to the differential component signal carried on the second metal trace 330b relative to that carried on first metal trace 330a.

In a further embodiment of the present invention, modification of the cutouts associated with printed circuit board connectors can be made. Printed circuit board connectors require solder pad connections in a similar way to DC blocking capacitors. Consequently, impedance discontinuities would result, absent a ground plane cutout associated with the solder pads. Thus, by modifying the ground plane cutout associated with the shorter length trace, a similar improvement can be achieved.

Figure 9:
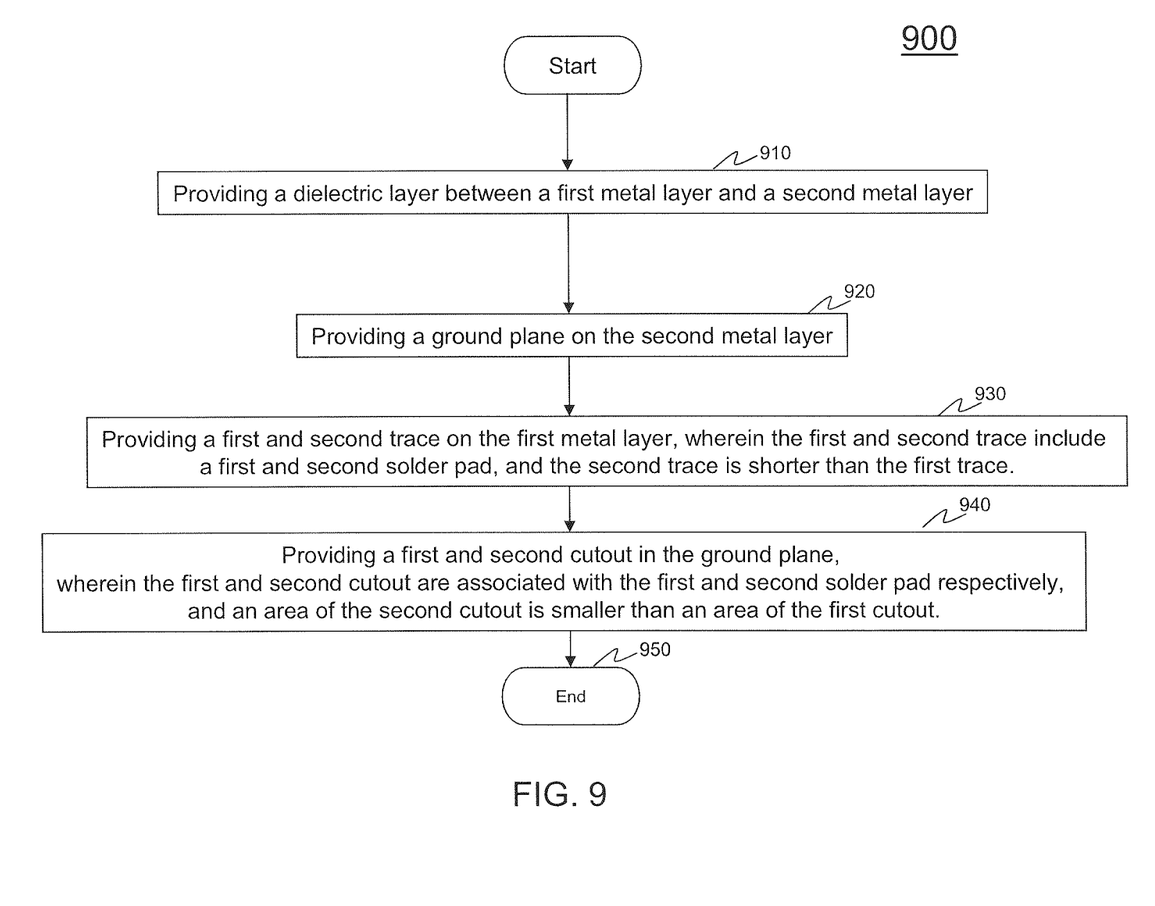
FIG. 9 provides a flowchart of a method that provides a time delay to a shortened trace in a differential microstrip trace pair, according to an embodiment of the current invention.

FIG. 9 provides a flowchart of an exemplary method 900 that uses a printed circuit board 300 to provide differential length compensation, according to an embodiment of the present invention.

The process begins at step 910. In step 910, a dielectric layer is provided between a first metal layer and a second metal layer. A typical dielectric layer would be 150 in FIG. 1, and a typical first metal layer and second metal layer would be 310 and 320 in FIG. 3.

In step 920, a ground plane is provided on the second metal layer. An example ground plane is shown as 340 in FIG. 3.

In step 930, a first and second trace are provided on the first metal layer, such that the first and second trace each have a solder pad, and where the second trace is shorter than the first trace. An example of the first and second trace is shown as 330a, 330b in FIG. 3. An example of the first and second solder pads are shown as 350a, 350b in FIG. 3.

In step 940, a first and second cutout are provided in the ground plane, such that that the first and second cutout are associated with the first and second solder pads respectively, and the area of the second cutout is smaller than the area of the first cutout. An example of the first and second cutouts are shown as 360a, 360b in FIG. 3.

At step 950, method 900 ends.

It is to be appreciated that the Detailed Description section, and not the Summary and Abstract sections, is intended to be used to interpret the claims. The Summary and Abstract sections may set forth one or more but not all exemplary embodiments of the present invention as contemplated by the inventor(s), and thus, are not intended to limit the present invention and the appended claims in any way.

The present invention has been described above with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The foregoing description of the specific embodiments will so fully reveal the general nature of the invention that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

What is claimed is:

1. A substrate, comprising:
   a first metal layer including a first trace and a second trace;
   a second metal layer including a ground plane;
   a dielectric layer arranged between the first and second metal layers;
   a first solder pad and a second solder pad connected to the first trace and the second trace respectively; and
   a first cutout and a second cutout in the ground plane corresponding with the first solder pad and the second solder pad respectively, wherein a length of the second trace is shorter than a length of the first trace, wherein an open area of the second cutout is less than an open area of the first cutout, wherein the ground plane is a single-layer ground plane, and wherein the second cutout includes a second perimeter that is substantially the same as a first perimeter of the first cutout, and the second cutout includes patterned metal interior to the second cutout.

2. The substrate of claim 1, wherein the first metal layer further comprises a top layer of the substrate.

3. The substrate of claim 1, wherein the second metal layer further comprises a bottom layer of the substrate.

4. The substrate of claim 1, wherein the patterned metal interior of the second cutout comprises one or more metal members that extend across an inner space of the second cutout.

5. The substrate of claim 4, wherein the one or more metal members includes at least one metal member that is perpendicular to another metal member.

6. The substrate of claim 1, wherein the first trace, second trace, ground plane and dielectric layer form a differential microstrip transmission line.

7. The substrate of claim 1, wherein the first solder pad and the second solder pad are associated with DC blocking capacitors.

8. The substrate of claim 1, wherein the first solder pad and the second solder pad are associated with printed circuit board connectors.

9. The substrate of claim 1, wherein the first solder pad and the second solder pad are vertically aligned with the first cutout and the second cutout respectively.

10. The substrate of claim 1, wherein the first cutout is not contiguous with the second cutout.

11. A method of manufacturing a substrate, comprising:
    providing a dielectric layer between a first metal layer and a second metal layer;
    providing a ground plane on the second metal layer;
    providing first and second traces on the first metal layer, wherein the first and second traces include first and second solder pads respectively, and wherein the second trace is shorter than the first trace; and
    providing a first cutout and a second cutout in the ground plane, wherein the first and second cutouts correspond with the first and second solder pads respectively, an open area of the second cutout is smaller than an open area of the first cutout, wherein the ground plane is a single-layer ground plane, and wherein the providing the second cutout includes providing the second cutout with a second perimeter that is substantially the same as a first perimeter of the first cutout, and the second cutout includes patterned metal interior to the second cutout.

12. The method of claim 11, wherein the first metal layer further comprises a top layer of the substrate.

13. The method of claim 11, wherein the second metal layer further comprises a bottom layer of the substrate.

14. The method of claim 11, wherein the providing the second cutout includes providing the patterned metal interior to the second cutout that comprises one or more metal members that extend across the open area of the second cutout.

15. The method of claim 14, wherein the providing the second cutout includes providing one or more metal members that include at least one metal member that is perpendicular to another metal member.

16. The method of claim 11, wherein the providing the dielectric layer, the first and second metal layers, the ground plane, and the first and second traces includes forming a differential microstrip transmission line.

17. The method of claim 11, wherein the providing the first solder pad and the second solder pad is associated with a subsequent process of coupling DC blocking capacitors.

18. The method of claim 11, wherein the providing the first solder pad and the second solder pad is associated with a subsequent process of coupling printed circuit board connectors.

19. The method of claim 11, wherein the providing the first solder pad and the second solder pad includes vertically aligning the first solder pad and the second solder pad with the first cutout and the second cutout respectively.

20. A substrate, comprising:
    a first metal layer including a first trace and a second trace;
    a second metal layer including a ground plane;
    a dielectric layer arranged between the first and second metal layers;
    a first solder pad and a second solder pad connected to the first trace and the second trace respectively; and
    a first cutout and a second cutout in the ground plane corresponding with the first solder pad and the second solder pad respectively, the first cutout and the second cutout having a first patterned metal interior and a second patterned metal interior respectively, wherein a length of the second trace is shorter than a length of the first trace, wherein the first patterned metal interior is different from the second patterned metal interior, and wherein the ground plane is a single-layer ground plane.

* * * * *